US008383296B2

(12) United States Patent
Favre et al.

(10) Patent No.: US 8,383,296 B2
(45) Date of Patent: Feb. 26, 2013

(54) METHOD FOR MANUFACTURING PHOTOMASKS AND DEVICE FOR ITS IMPLEMENTATION

(75) Inventors: Arnaud Favre, Annecy (FR); Magali Davenet, Annecy (FR); Jean-Marie Foray, Annecy (FR)

(73) Assignee: Alcatel Lucent, Paris (FR)

( * ) Notice: Subject to any disclaimer, the term of this patent is extended or adjusted under 35 U.S.C. 154(b) by 117 days.

(21) Appl. No.: 12/347,378

(22) Filed: Dec. 31, 2008

(65) Prior Publication Data

US 2009/0176166 A1     Jul. 9, 2009

(30) Foreign Application Priority Data

Jan. 4, 2008   (FR) .................................. 08 50056
Mar. 5, 2008  (FR) .................................. 08 51427

(51) Int. Cl.
*G03F 1/00*    (2012.01)
(52) U.S. Cl. .......................................... 430/5; 430/394
(58) Field of Classification Search .............. 430/5, 394; 134/1
See application file for complete search history.

(56) References Cited

U.S. PATENT DOCUMENTS

| 2001/0005944 | A1  | 7/2001  | Dao et al. |
| 2001/0014375 | A1  | 8/2001  | Tanaka |
| 2003/0104287 | A1* | 6/2003  | Yuasa ................................ 430/5 |
| 2005/0121144 | A1* | 6/2005  | Edo et al. .................. 156/345.32 |
| 2005/0214655 | A1* | 9/2005  | Zimmerman et al. ............ 430/5 |
| 2006/0019177 | A1  | 1/2006  | Mori et al. |
| 2006/0115741 | A1  | 6/2006  | Kozeki et al. |
| 2006/0243300 | A1  | 11/2006 | Klingbeil et al. |
| 2007/0092807 | A1* | 4/2007  | Fukushima et al. .............. 430/5 |
| 2007/0187272 | A1  | 8/2007  | Bonness et al. |
| 2008/0044744 | A1* | 2/2008  | Yamazaki et al. ................ 430/5 |

FOREIGN PATENT DOCUMENTS

| EP | 1777587      |   | 4/2007 |
| EP | 1832353      |   | 9/2007 |
| JP | 58-078429    | A | 5/1983 |
| JP | 05021411     |   | 1/1993 |
| JP | 2004514272   |   | 5/2004 |

(Continued)

OTHER PUBLICATIONS

European Search Report dated Apr. 8, 2009.

(Continued)

*Primary Examiner* — Mark F Huff
*Assistant Examiner* — Rashid Alam
(74) *Attorney, Agent, or Firm* — Fay Sharpe LLP

(57) ABSTRACT

The photomask manufacturing method comprises at least one step of cleaning the photomask and at least one step of placing a protective pellicle onto the photomask at the end of manufacturing. The inventive method further comprises at least one step of removing ammonia and sulfate residue between the cleaning step and the pellicle placement step. This step comprises the following operations:
  placing the photomask into a sealed chamber,
  creating a low pressure within the sealed chamber by pumping out the gases that it contains,
  exposing the photomask to infrared radiation,
  stopping the infrared radiation,
  checking that the temperature of the photomask does not exceed 50° C.,
  restoring the atmospheric pressure within the chamber, and
  removing the photomask from the chamber.

The device for implementing the inventive method comprises a sealed chamber containing at least one photomask, a pumping unit for creating and maintaining a vacuum inside the chamber, a system for holding at least one photomask, placed inside the sealed chamber, infrared radiation means and a gas injection system.

8 Claims, 4 Drawing Sheets

FOREIGN PATENT DOCUMENTS

| | | |
|---|---|---|
| JP | 2005274770 | 10/2005 |
| JP | 2006011048 | 1/2006 |
| WO | WO 01/97270 | 12/2001 |
| WO | WO 2005/116758 A2 | 12/2005 |
| WO | WO2009/020808 | 2/2009 |

OTHER PUBLICATIONS

PCT Search Report dated Aug. 7, 2009.

Jeng et al., "Porous Silica Pellicle Frame," Proceedings from the SPIE, SPIE, Bellingham, VA, vol. 5256, pp. 213-221, Jan. 1, 2003.
Eschbach et al., "ArF Lithography Reticle Crystal Growth Contributing Factors," Proceedings of the SPIE—The International Society for Optical Engineering, vol. 5567, No. 1, pp. 497-505, 2004.
French Search Report, Jul. 11, 2008.

* cited by examiner

METHOD FOR MANUFACTURING PHOTOMASKS AND DEVICE FOR ITS IMPLEMENTATION

REFERENCES

This application is based on French patent application #08 50 056, filed on Jan. 4, 2008, and French patent application #08 51 427, filed on Mar. 5, 2008, the disclosure of which is hereby incorporated by reference thereto in its entirety, and the priority of which is hereby claimed under 35 U.S.C. §119.

BACKGROUND OF THE INVENTION

The present invention pertains to a method for manufacturing photomasks, which are particularly used in the manufacture of microelectronic components with submicronic dimensions. Furthermore, it extends to the device for implementing this method.

Semiconductor substrates, particularly those made of silicon, are currently micro-machined using plasma etching techniques based on a pattern transferred onto the substrate from a mask. A photomask is equivalent to a photographic negative: it contains information to be printed onto a medium. It is generally used as a transmission method for exposures and printing onto semiconductor substrates. Various parameters, including the focusing wavelength, define the depth of the active area, which is printed directly onto the substrate. Outside of the active area, the details are not printed, but may have an impact on the transmission of the photomask. Pollution in the active area has a direct effect on the image printed onto the substrate, because a defect will be printed. However, this pollution only has an indirect effect on this image if it occurs outside of this area, such as lowering the contrast or reducing the transmission of the photomask.

Furthermore, the semiconductor industry is researching how to reduce the dimensions of the printed image in order to obtain electronic components which are increasingly small and integrable, and less expensive. The dimensions of photomasks are becoming smaller, while pollution requirements are becoming ever stricter. The photomask is therefore a key, expensive, and complex element which should be kept clean and operational.

The active surface of the photomasks must be free of all particles, particularly in the focal plane, as these contaminating particles create a defect which is printed and which is reproduced on the semiconductor substrate. At the end of its manufacturing process, the mask is cleaned, and then a pellicle is applied to the photomask in order to protect its active surface from any particles. The purpose of the pellicle is to protect the photomask during its lifetime of use by the user. The pellicle consists of an optical membrane deposit (parallel multilayer surfaces) with a good transmission and a reduced impact on the optical rays which pass through it. This pellicle is deposited beside the active surface of the photomask, and separated from it by a space. The pollutants that could accumulate onto the active surface of the photomask will thereby accumulate onto the pellicle, outside of the focus area (physically separated from the active surface). In this way, these pollutants will not be printed during the lithographic transfer: the pellicle does not directly protect against particulate pollutants, but it makes possible to reduce their impact on the image.

The document US-2001/005944 pertains to eliminating gas contaminants that came from the surrounding atmosphere, such as $O_2$, $CO_2$ and $H_2O$, which may be present in the space between the photomask and the pellicle. These contaminants are particularly harmful, as they prevent the photolithographic operation from proceeding properly by inhibiting the transmission of radiation at 157 nm, which is normally used. Decontamination takes place in a sealed chamber, in a vacuum or in an optically inert gas, via exposure to UV radiation, plasma, ozone, and/or heat. This treatment causes the gas desorption to accelerate.

However, the increase in energy needed for exposure in order to create ever smaller patterns has resulted in a new problem. The gases found beneath the pellicle, such as ammonia, fluorine, and volatile organic compounds, combine when exposed to this high energy to create crystals which grow over time. The crystals which appear beneath the pellicle, and therefore in the focus area, produce defects in the printed area on the substrate. These crystals represent a major problem, because they cause numerous unforeseeable defects on the substrates, and may affect more than 20% of the most advanced current photomasks.

One of the chemical reactions that occur may be summarized by the following formula:

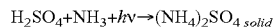

$$H_2SO_4 + NH_3 + h\nu \rightarrow (NH_4)_2SO_4\,_{solid}$$

Ammonia ($NH_3$) comes from multiple sources, but essentially from human activity in the photomask manufacturing areas, and from the use of these photomasks. With the goal of reducing the phenomenon of crystal growth, semiconductor and photomask manufacturers have made massive investments to limit the ammonia found in the clean room, and have set strategies for storing and transporting photomasks in protected environments in order to reduce their contact with the ammonia.

Sulfuric acid ($H_2SO_4$) is commonly used by photomask manufacturers during the steps of the manufacturing process, particularly during etching and stripping operations. In the most common occurrence, the last step of the cleaning process, before the pellicle placement step, requires sulfates and generates sulfate residue. The last step of the stripping process, which consists of removing the previously applied resin and which comes before cleaning, also generates sulfate residue. This sulfate residue trapped beneath the pellicle will therefore desorb, which is the main reason why these crystals appear in silicon chip manufacturers' plants. Photomask manufacturers make an effort to reduce the quantity of sulfates used during the cleaning steps, by modifying the methods or by adding steps intended to reduce sulfate residue content. However, these new methods or the mitigating techniques that are instituted are costlier and less effective, and it is not possible to completely eliminate the usage of sulfates during the steps of the manufacturing process.

The pellicle is put into place after a stripping step followed by a cleaning step. The last cleaning step is carried out in a clean area. This pellicle will make it possible to keep the particles generated in the clean room or in the production equipment from accumulating onto the active surface of the photomask.

One of the mitigating solutions consists of periodically inspecting the photomask's active surface. As soon as the first crystals appear, the photomask is returned to its manufacturer. The pellicle is removed and cleaned, and then a new pellicle is applied to the photomask. This operation must be carried out by the photomask manufacturers and not by the users, which causes wasted time and major additional costs for managing the stock due to the photomasks' shortened lifespan.

SUMMARY OF THE INVENTION

The biggest problem today for semiconductor components manufacturers is therefore the availability and lifespan of these photomasks for producing semiconductors. This is because these photomasks are a major link in the chain of manufacturing silicon chips, and their increased sophistication leads to ever higher costs.

The purpose of the present invention is therefore to allow photomasks a longer lifespan, by reducing the frequency of cleaning operations.

A further purpose of the invention is to reduce the risk of photomask degradation related to pollution by the formation of crystals in the volume beneath the pellicle.

A further purpose of the invention is to disclose a method enabling the removal of residual ammonia and sulfate compounds resulting from the manufacturing of photomasks.

The object of the present invention is a photomask manufacturing method comprising at least one step of cleaning the photomask and at least one step of placing a protective pellicle onto the photomask. The method further comprises at least one step of removing ammonia and sulfate residue between the cleaning step and the pellicle placement step. The step of removing ammonia and sulfate residue comprises:

placing the photomask into a sealed chamber,
creating a low pressure within the sealed chamber by pumping out the gases that it contains,
exposing the photomask to infrared radiation,
stopping the infrared radiation,
checking that the temperature of the photomask does not exceed 50° C.,
restoring the atmospheric pressure within the chamber, and
removing the photomask from the chamber.

Preferentially, the gases are pumped for a period of time between 20 minutes and 5 hours.

The infrared radiation (IR) accelerates the selective desorption of the targeted chemicals, and improves their performance. Pumping out the gases contained within the chamber in order to create a vacuum inside it, which is carried out at the same time as the infrared radiation, improves the desorption of the residue considerably, and particularly makes it possible to desorb nearly all of the ammonia and sulfate compounds that result from the cleaning and stripping steps. Removing the ammonia and sulfate residues makes it possible to apply the protective pellicle onto a perfectly clean substrate.

The wavelength of the infrared radiation is the main parameter that influences desorption, the depth of which varies depending on the wavelength selected. Waves of infrared radiation whose wavelength is said to be "short" will penetrate into the material more deeply than "medium" or "long" wavelengths, which will be more effective on the surface.

The infrared radiation must be carefully controlled, because it causes the photomask, whose temperature may not exceed 300° C., to heat up. Above 300° C., the photomask becomes irreversibly damaged. The temperature may be between 50° C. and 300° C., preferentially between 50° C. and 1500° C., and very preferentially at a temperature close to 80° C. The increase in temperature that results from applying infrared radiation contributes to the acceleration of the phenomenon of diffusion desorption.

Advantageously, the atmospheric pressure is restored within the chamber when the temperature inside the chamber is less than or equal to 50° C., which may require a wait period after the infrared radiation is stopped.

In one particular variant, a clean gas is injected at a constant flow rate at the same time as the gas is being pumped out of the chamber. The presence of such a gas may accelerate desorption of certain other organic compounds.

The pressure inside the chamber is preferentially returned to normal by injecting a clean, non-reactive gas, such as air or a neutral gas like nitrogen or argon.

In order to further increase performance, the ammonia and sulfate residue removal method may be used not only after the final cleaning step, but also after other manufacturing steps before cleaning which involve the use of sulfate residue, such as the stripping step.

A further object of the invention is a device for implementing the method described above, comprising:

a sealed chamber containing at least one photomask,
a pumping unit to create and maintain the vacuum within the chamber,
a system for holding at least one photomask, placed inside the sealed chamber,
infrared radiation means,
a gas injection system.

The holding system may advantageously be designed to enable the simultaneous treatment of multiple photomasks.

In one variant embodiment of the device, the inner walls of the chamber reflect the emitted waves.

In another variant embodiment, the gas injection system comprises one or more shower-style injectors.

In another variant embodiment, the gas injection system comprises one or more particle filters.

The device may further comprise a pressure gauge to check the pressure inside the chamber.

The device may also comprise a temperature probe in order to measure the temperature of the photomask.

DESCRIPTION OF THE FIGURES

Other characteristics and advantages of the present invention will become apparent during the following description of embodiments, which naturally are given as non-limiting examples, and in the attached drawing, in which FIG. 1 schematically depicts the steps of one embodiment of the inventive method, FIG. 2 schematically depicts an example way of positioning the infrared radiation means with respect to the photomasks.

DETAILED DESCRIPTION OF EMBODIMENTS

Figure 1:
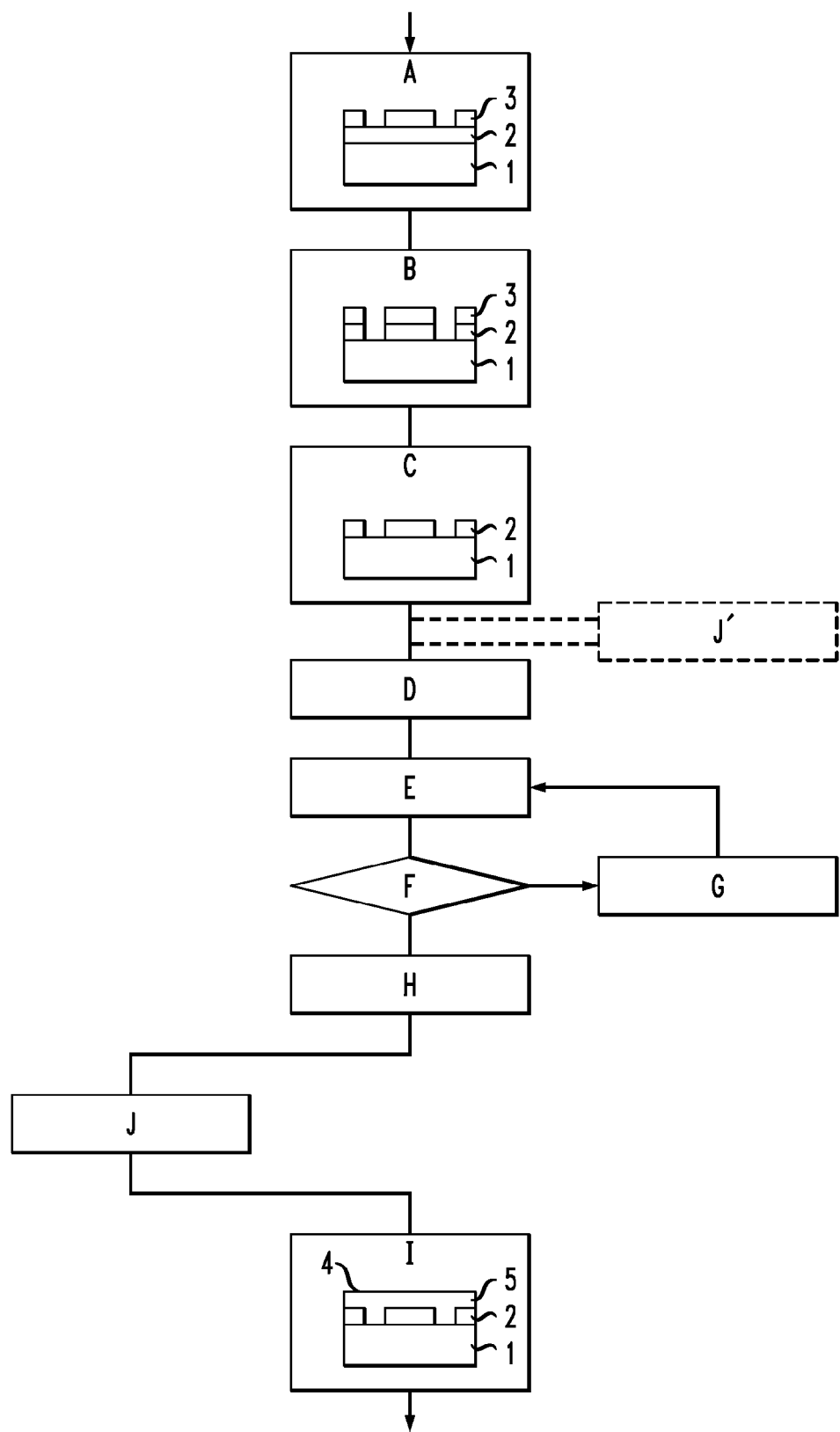

One embodiment of the inventive photomask manufacturing method is schematically depicted in FIG. 1. The manufacturing of photomasks normally comprises multiple steps. A substrate, for example one made of quartz 1 covered with chrome 2, is covered with a layer of resin 3 upon which the pattern to be etched is reproduced by means of a laser or electron beam, for example (step A). Step B is an etching step during which the pattern is etched into the chrome layer 2. During a step C, the photomask, once it has been etched, is moisture-stripped in order to remove the resin 3 and the byproducts from the chemical reaction. The resulting photomask then undergoes multiple successive cleaning steps (step E), control steps (steps D and F) and potentially repair steps (step G) during steps D through G. A final cleaning is performed during step H. Commonly used cleaning conditions involve the use of sulfates, which must be removed before step 1, in which the photomask is covered by a protective pellicle 4. This is because for aforementioned reasons, the presence of sulfates in the active area 5 of the photomask beneath the pellicle 4 must be totally avoided.

A step J of removing the ammonia and sulfate residue, implementing the combination of infrared radiation and vacuum pumping, is interspersed between cleaning step H and pellicle-placement step 1, in such a way as to remove the contamination from the photomask, particularly sulfate contamination. This step J comprises multiple operations, which form three distinct phases.

During a first phase, with the photomask in the chamber, the gases present inside the chamber are pumped out. During this part, the control parameter is the pumping speed. The slope of the pressure drop is adjusted so as to keep the water from crystallizing. Simultaneously, the infrared radiation means are turned on in order to enable the preconditioning of the wavelength control system. The photomask is subjected to infrared radiation in order to enable the acceleration of contaminant degassing, while the pumping continues.

The second phase takes place at a constant temperature and pressure. The three parameters—temperature, pressure, and IR wavelength—are interdependent. The wavelength of the infrared radiation is adjusted to enable desorption of the ammonia and sulfate residue. The pressure makes it possible to control the desorption threshold, and the temperature is controlled in order to enable the adjustment of the wavelength.

With the infrared radiation off, the third phase begins with an increase in pressure inside the chamber, once the chamber has reached a temperature less than or equal to about 50° C. The low pressure within the chamber contributes to decreasing the temperature. The control parameter of this phase is the temperature. A pressure control inside the chamber may also be used to control the cooling. The increase in pressure is achieved using a clean, non-reactive gas. At the end of the cycle, the imposed pressure of clean gas is slightly higher than the atmospheric pressure over a short stretch of time, so as to encourage the adsorption of the clean gas on the surface of the photomask, which helps protect it from outside contaminants once it is removed from the chamber. The photomask is cooled at a temperature no greater than 50° C., so as to bring the chamber to a temperature close to the surrounding temperature, in order to prevent the re-adsorption of the gases found within the atmosphere, which could occur when the temperature decreases.

In another embodiment, this step J of removing ammonia and sulfate residues may also take place before the cleaning step H, particularly after certain steps involving the persistence of sulfate residue. A removal step J' may, for example, further be interspersed between the stripping step C and the control step D.

Figure 2:
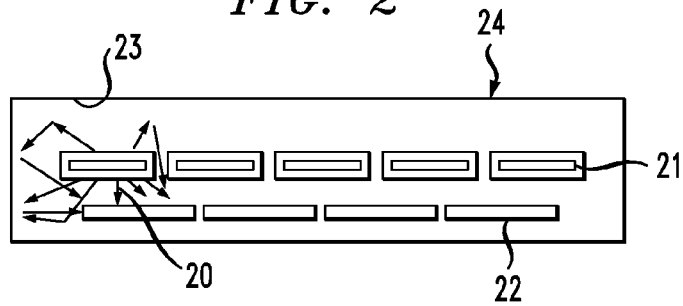

FIG. 2 shows an example of the way in which the infrared radiation 20 generated by the radiation means 21 reflects onto both the photomasks 22 and the reflective inner walls 23 of the sealed chamber 24. The heating elements may be placed above the photomasks and/or below the photomasks, or between two layers of photomasks, for example.

The usage of infrared radiation is preferred because its selectivity with regard to the chemicals to remove, and its performance in a vacuum is high. By wisely choosing the characteristics of the infrared radiation 20, such as its wavelength, the depth of desorption can be made to vary. Waves of infrared radiation whose wavelength is said to be "short" will penetrate into the material more deeply than "medium" or "long" wavelengths, which will be more effective on the surface.

A temperature less than 300° C., for example one close to 80° C., may be applied without damaging the photomask. Advantageously, a hashing-based infrared radiation emission control, i.e. one which successively applies a voltage V and zero voltage, making it possible to achieve infrared radiation power peaks, is used. This control makes it possible to control the heating of the photomasks without losing the characteristics (wavelength) of the infrared radiation. This control also makes it possible to vary the wavelength of the infrared radiation. By associating the hashing-based infrared radiation emission control and modifying the wavelength of the infrared radiation, it is thereby possible to cause desorption of the photomask at multiple depths within the material.

In order to apply the infrared energy to the photomask, another method is to use a microwave generator, coupled to a metal bar, which will radiate infrared waves.

Figure 3:
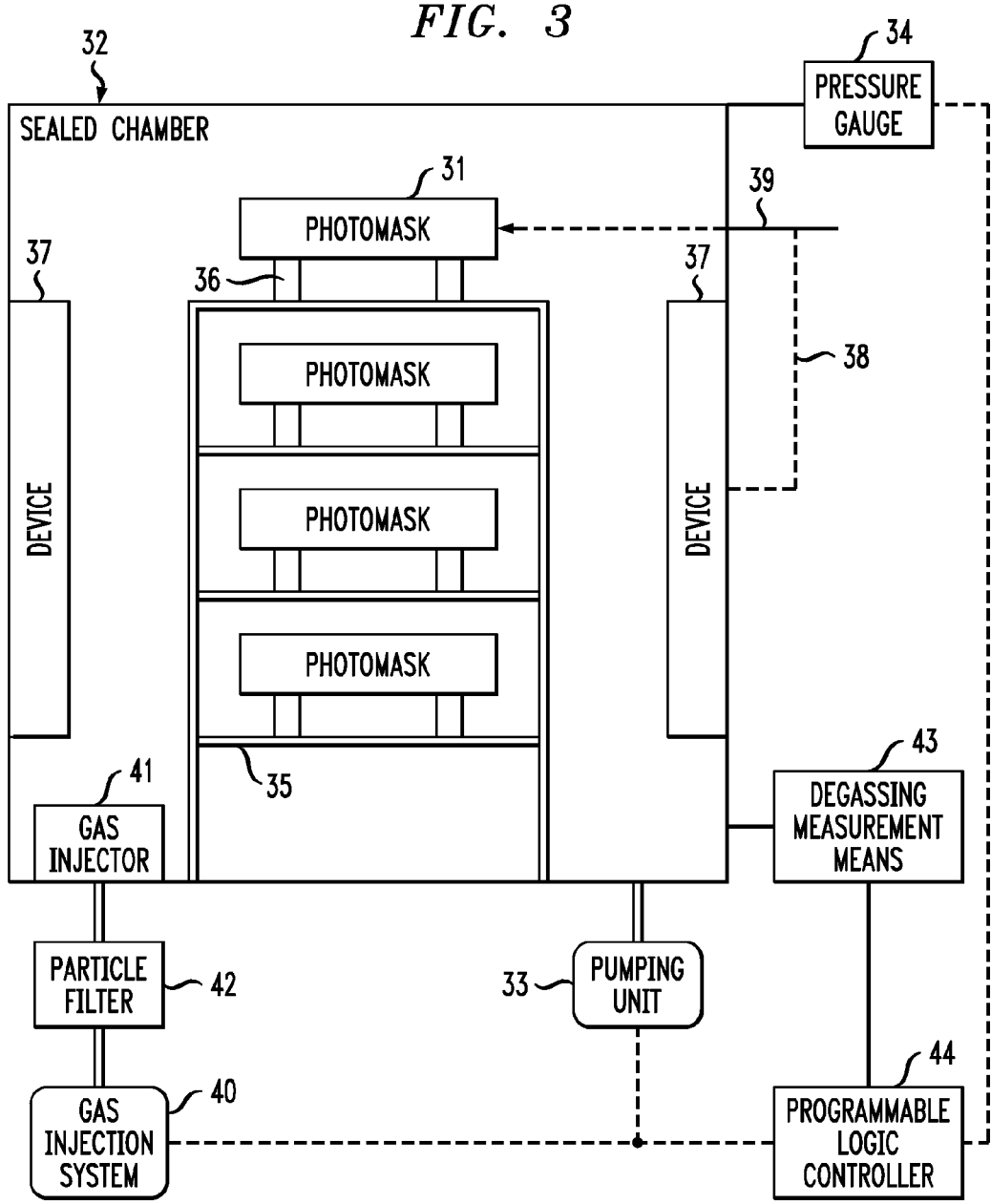
FIG. 3 depicts an installation adapted to perform the ammonia and sulfate residue removal step.

In the embodiment of the invention depicted in FIG. 3, the photomasks 31 (which do not yet have a pellicle) are placed inside a sealed chamber 32 kept at a vacuum by means of a pumping unit 33. A pressure gauge 34 makes it possible to check the pressure inside the chamber 32. The photomasks are placed on overlapping racks 35 and they are supported by non-metallic spacers 36. In this situation, the photomasks are subjected to infrared radiation by means of a device 37 disposed on the wall of the chamber 32, such as a microwave device as mentioned above. The device 37 is operated by a radiation control loop 38 based on the temperature of the photomask 31 as measured by the associated temperature probe 39. The geometry and arrangement of the radiating elements 37 are chosen so as to achieve a uniform, optimized action across the entire surface of the photomasks 31.

Advantageously, the surface of the chamber 32 may be mechanically or electrolytically polished in order to encourage the reflection of the infrared radiation onto the photomasks 31. The shape of the chamber 32 also makes it possible to uniformly distribute the infrared radiation.

One of the major restrictions that apply to the installation is that the implementation of the method may not generate particles. This is why the gas injection system 40 comprises at least one shower-style injector 41 making it possible to reduce the injection speed into the vacuum chamber 32. The injection system 40 is further equipped with particle filters 42. Advantageously, the injection system 40 comprises one or more shower-style gas injectors 41, which prevents gas turbulence when returning the chamber 32 to atmospheric pressure. The step of returning the chamber to atmospheric pressure takes place in accordance with a mathematical equation whose form is: $y=ax^2+b$, in which y is the flow rate and x is the pressure. This procedure allows for a low injection speed at low pressure, as particle contamination is higher at a low pressure.

During the ammonia and sulfate residue removal step, the degassing measurement means 43 are used to insure that the operations proceed properly, by tracking at least one of the following parameters:

the partial pressure of the gases,
the limit pressure of the pumping unit 33,
the weight of the photomask 31,
the power reflected by the chamber's walls 32.

The pumping unit 33, the injection system 40 and the degassing measurement means 43 are connected to a programmable logic controller 44, or PLC.

Figure 4:
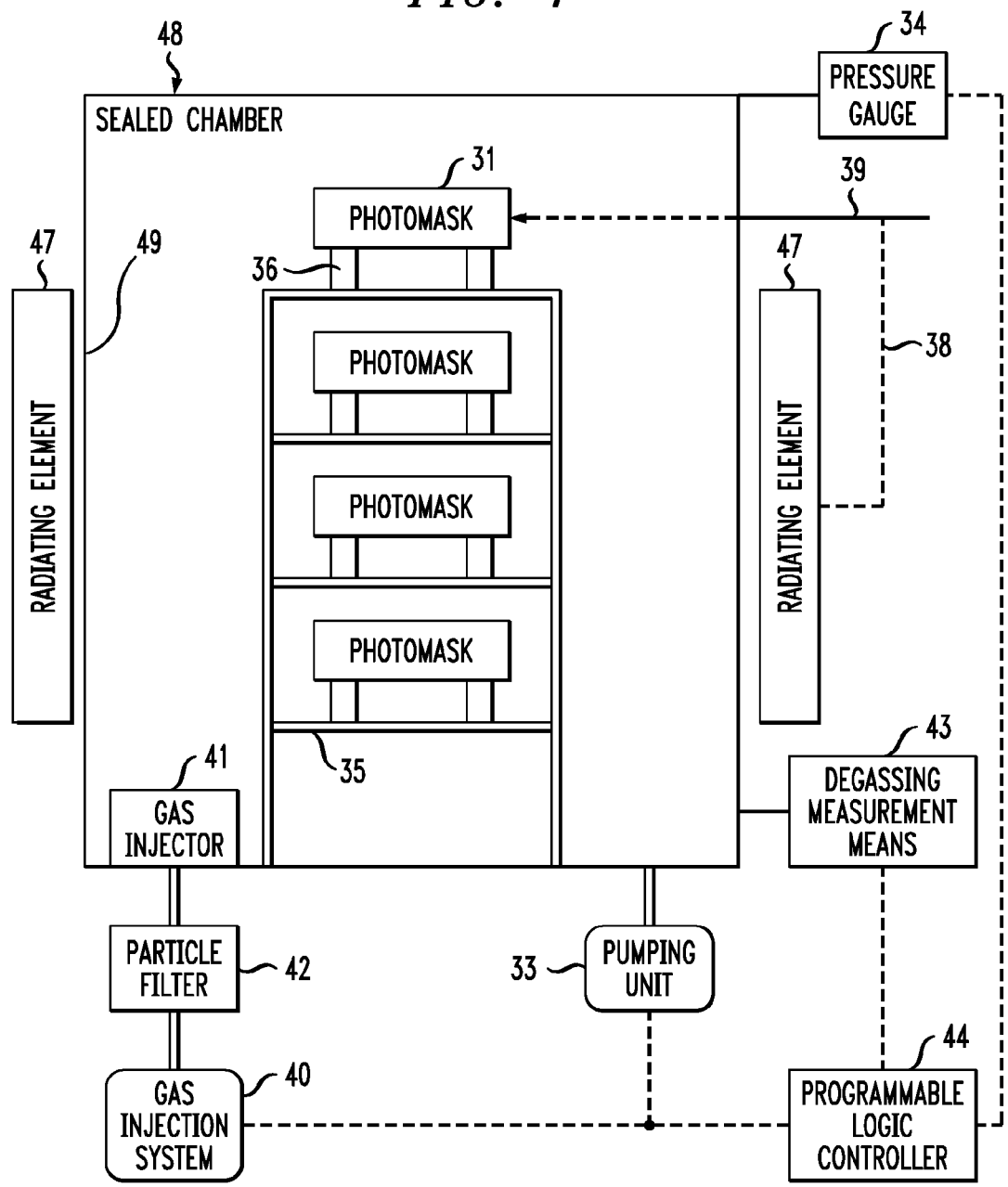
FIG. 4 depicts a variant of an installation adapted to perform the ammonia and sulfate residue removal step.

Now we will look at FIG. 4, which depicts another embodiment of an installation 31 adapted to perform the step of removing ammonia and sulfate residue, wherein the radiation device 47 is placed outside the vacuum chamber 48. An interface 49, such as a window, placed within the wall of the chamber 48, allow waves to pass through, in the direction of the photomask 31. The choice of the material that makes up the interface 49 between the radiation device 47 and the photomasks 31 is critical, as this material must allow the waves intended for the photomask 31 to pass through without causing a problem by dissipating the radiation that they carry. Quartz shall advantageously be chosen.

Figure 5:
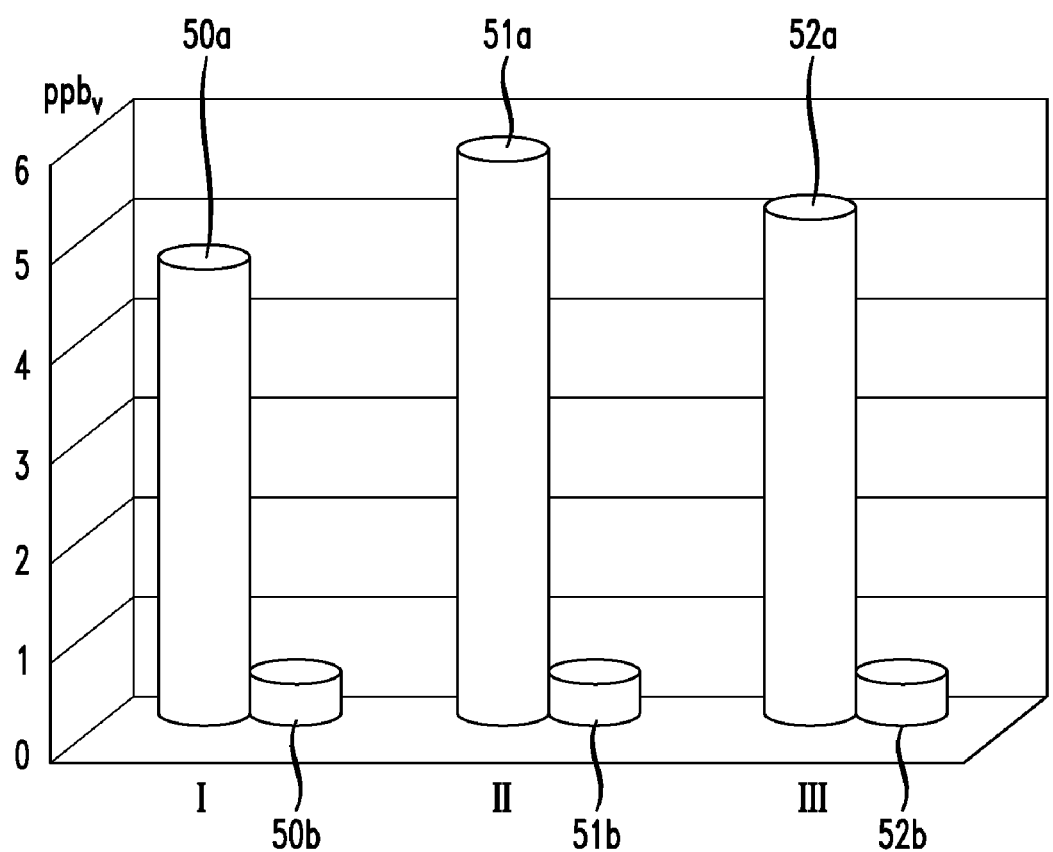
FIG. 5 is a comparison of the rates of residual sulfates in photomasks at the end of the manufacturing process.

FIG. 5 gives the comparative results of measuring the rate of residual sulfates in the photomask, as measured using the ion chromatography process. The rates of sulfates 50*a*, 51*a*, 52*a* result from the photomask cleaning operation, using three different variants I, II, III of the cleaning method. The rates of sulfates 50*b*, 51*b*, 52*b* are obtained upon the completion of the removal step in accordance with an embodiment of the invention, which follows a cleaning step for each of the three variants. Comparing these results shows the effectiveness of the removal step on the sulfate content of the photomasks. The current goal of photomask manufacturers for 193 nm technologies is to achieve a sulfate rate less than 1 ppbv (parts per billion by volume), so as not to have any crystal growth problems among their clients. FIG. 5 shows that the values achieved 50*b*, 51*b*, 52*b* using the invention are mostly below this goal.

The invention claimed is:

1. A method for manufacturing photomasks, comprising at least one step of cleaning the photomask and at least one step of placing a protective pellicle onto the photomask, and further comprising at least one step of removing ammonia and sulfate residue between the cleaning step and the pellicle placement step, the step of removing ammonia and sulphate residue comprising:
    placing the photomask into a sealed chamber,
    creating a low pressure within the sealed chamber by pumping out the gases that it contains,
    exposing the photomask to infrared radiation, with a hashing-based infrared radiation emission control and wherein the photomask is heated at a temperature between 50° C. and 300° C.,
    stopping the infrared radiation,
    waiting that the temperature of the photomask does not exceed 50° C. before restoring the atmospheric pressure,
    restoring the atmospheric pressure within the chamber by injecting a clean, non-reactive gas, and
    removing the photomask from the chamber.

2. A method according to claim 1, wherein the gases are pumped for a period of time between 20 minutes and 5 hours.

3. A method according to claim 1, wherein a clean gas is injected at a constant flow rate at the same time as the pumping.

4. A method according to claim 1, wherein atmospheric pressure is restored by injecting a clean, non-reactive gas.

5. A method according to claim 1, further comprising a step of removing ammonia and sulfate residue after another manufacturing step and before said cleaning step.

6. A device for implementing the method according to claim 1, comprising:
    a sealed chamber containing at least one photomask,
    a pumping unit to create and maintain a vacuum within the chamber,
    a system for holding at least one photomask, placed inside the sealed chamber,
    infrared means having hashing-based infrared radiation emission control means able to heat the photomask at a temperature between 50° C. and 300° C.,
    cooling means of the photomask at a temperature less than or equal 50° C. after the infrared radiation is stopped, before restoring the atmospheric pressure within the chamber
    a gas injection system comprising at least one clean, non-reactive gas injector, for restoring the atmospheric pressure within the chamber.

7. A device according to claim 6, wherein the inner walls of the chamber reflect emitted waves.

8. A device according to claim 6, wherein the gas injection system comprises at least one shower-style injector and at least one particle filter.

* * * * *